United States Patent
Shimizu et al.

(10) Patent No.: US 6,225,860 B1
(45) Date of Patent: *May 1, 2001

(54) SOURCE VOLTAGE DETECTING CIRCUIT

(75) Inventors: Katsuya Shimizu, Otsu; Toshihiro Shimogasa, Yokosuka, both of (JP)

(73) Assignee: Kondenshi Corporation, Kyoto (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/178,425

(22) Filed: Oct. 26, 1998

(30) Foreign Application Priority Data

Oct. 27, 1997 (JP) .................................................. 9-312776

(51) Int. Cl.[7] ............................................................. H01J 19/82
(52) U.S. Cl. ..................................................................... 327/568
(58) Field of Search ................................... 327/568, 570, 327/571, 572, 573; 326/132

(56) References Cited

U.S. PATENT DOCUMENTS

| | | | |
|---|---|---|---|
| 3,670,183 | * 6/1972 | Ager et al. | 327/568 |
| 4,028,562 | * 6/1977 | Zuleeg | 327/568 |
| 5,281,871 | * 1/1994 | Mori et al. | 327/570 |
| 5,304,858 | * 4/1994 | Heitzer et al. | 327/568 |

FOREIGN PATENT DOCUMENTS

| | | |
|---|---|---|
| 6-44210 | 6/1994 | (JP) . |
| 7-336200 | 12/1995 | (JP) . |

* cited by examiner

Primary Examiner—Jung Ho Kim
(74) Attorney, Agent, or Firm—Armstrong Westerman Hattori McLeland & Naughton, LLP

(57) ABSTRACT

The provision of a source voltage detecting circuit suitable for integrated circuits, wherein a very simple circuit arrangement makes it possible to satisfy various characteristics required by source voltage detection and to control detection voltage in wafer process. A source voltage detecting circuit, comprising a first resistor $R_1$, a second resistor $R_2$ and a reference voltage source RV which are connected in series between a power source $V_{CC}$ and the ground GND, wherein the point of connection $P_1$ between said first and second resistors $R_1$, and $R_2$ is connected to the output terminal of a negative resistance characteristic section NR, and the point of connection $P_2$ between said second resistor $R_2$ and the reference voltage source RV is connected to the input terminal of the negative resistance characteristic section NR.

3 Claims, 6 Drawing Sheets

SOURCE VOLTAGE DETECTING CIRCUIT

BACKGROUND OF THE INVENTION

1. Field of the Invention

This invention relates to a source voltage detecting circuit suitable for integrated circuits which is used to monitor the source voltage fed to a microcomputer or the like and to prevent a runaway or malfunction of a microcomputer or the like due to a lowering in said source voltage.

2. Description of Prior Art

An example of a source voltage monitoring circuit which has heretofore been used in common is shown in FIG. 10. In the source voltage monitoring circuit shown in FIG. 10, a reference voltage provided by a Zener diode $Z_1$, is fed to one of the inputs of a comparator $COM_1$, and the source voltage $V_{CC}$ is divided by resistors $R_{10}$ and $R_{11}$, one such divisional voltage being fed as the detected voltage to the other input of said comparator $COM_1$. The source voltage drop is constantly monitored in that the reference voltage and the detected voltage is compared with each other by the comparator. In the source voltage monitoring circuit shown in FIG. 10, however, the reference voltage section, the detection voltage section and the comparator section each consume electric current, making it difficult to achieve lower consumption, so that this circuit is not suitable for use in battery-driven portable devices.

Accordingly, a circuit example as shown in FIG. 11 has been put into practical use to keep pace with the recent trend toward lower current consumption. The circuit example shown in FIG. 11 comprises a source voltage drop detecting circuit 11 using transistors $Q_2$–$Q_3$ and resistors $R_{13}$–$R_{18}$, a differential amplifier type comparator 12 using transistors $Q_4$–$Q_8$ and resistors $R_{19}$–$R_{24}$, and an output control circuit 13 using transistors $Q_{10}$–$Q_{12}$ and resistors $R_{21}$–$R_{24}$, said source voltage drop detecting circuit 11 being compensated for temperature by $V_{BE}$ multiplier 14 using a transistor $Q_2$ and resistors $R_{13}$–$R_{14}$. And for hysteresis formation, the difference in $V_{BE}$ between the transistors $Q_6$ and $Q_7$ is utilized, said transistor $Q_7$ having an emitter area which is N times as large as the transistor $Q_6$. Further, capacitors $C_1$ and $C_2$ are provided for improving the response characteristic.

SUMMARY OF THE INVENTION

In the conventional circuit as described above, although the reference voltage section and the detection voltage section $V_{CC}$ are disposed on the same line between $V_{CC}$, as compared with FIG. 10, there are still two lines with current constantly flowing therethrough: a line extending from the multiplier to a transistor $Q_3$ for reference voltage, and consumption by a constant voltage source $Q_8$ for differential amplification. Therefore, a large resistance has to be used for lower consumption, resulting in a larger chip area, a fact which has been a major cause of increased costs.

In the reference voltage source, the voltage detecting circuit, and the voltage detecting circuit using a differential amplifier type comparator as generally shown in FIGS. 10 and 11, about 30 elements including transistors, resistors and capacitors are required to improve output current, temperature characteristic, hysteresis, response characteristic, etc., for a circuit, so that it has been difficult to further reduce costs for an integrated circuit.

Further, the detection voltage is determined by a circuit constant, and a circuit design has to be made for each required detection voltage; in an integrated circuit, a pattern mask has to be prepared each time.

Accordingly, this invention tackles these problems and is intended to provide a source voltage detecting circuit suitable for integrated circuits, using very simple circuit arrangement to satisfy the various characteristics required for source voltage detection, and to make it possible to control the detection voltage in the wafer process.

To achieve the above object, specifically, this invention provides a source voltage detecting circuit, comprising first and second resistors and a reference voltage source which are connected in series between a power source and the ground, wherein the point of connection between said first and second resistors is connected to the output terminal of a negative resistance characteristic section, and the point of connection between said second resistor and the reference voltage source is connected to the input terminal of the negative resistance characteristic section.

Further, this invention also provides a source voltage detecting circuit in the form of a base modulation bipolar transistor wherein said negative resistance characteristic section includes a first electrically conductive type collector region serving as an output section, a second electrically conductive type base region formed through a first PN junction with respect to said collector region, and a first electrically conductive type emitter region formed through a second PN junction with respect to said base region, and wherein said base region includes a first base region disposed adjacent said emitter region through said second PN junction, a base contact region spaced from said first base region and serving as the input section of the negative resistance characteristic section and serving to take out the base electrode, and a second base region of low impurity concentration formed between said first base region and said base contact region, said second base region provided therein with a gate region having a first electrically conductive type connected to the collector region, the arrangement being such that when a forward bias is applied between said base contact region and said base emitter region and when the collector region is energized with a reverse bias with respect to said base collector region, the base current flowing through said second base region is modulated to provide a negative resistance characteristic.

Further, this invention also provides source voltage detecting circuit wherein the negative resistance characteristic section uses the source of a junction type FET as the input section of the negative resistance characteristic section, the drain of the junction type FET being connected to the base of a bipolar transistor, the gate of said junction type FET being connected to the collector of said bipolar transistor, the collector of said bipolar transistor being the output section of the negative resistance characteristic section.

In the source voltage detecting circuit of this invention constructed in the manner described above, when source voltage decreases until the voltage across the second resistor is not more than the pinch-off voltage for the negative resistance characteristic section, said negative resistance characteristic section is switched on to produce an output. In this negative resistance characteristic section, no current whatever is consumed during standing by. Therefore, the current consumption occurs in the first and second resistors in the line extending to the reference voltage source, so that super low current consumption is made possible. The temperature characteristic for detection voltage can be cancelled by the pinch-off voltage at the negative resistance characteristic section, the reference voltage source, the first and second resistors, without requiring any special circuit element. As for the hysteresis, it is determined by the ratio of the first resistor to the resistor connected to the grounded side of the negative resistance characteristic section, and the number of elements is reduced to about ⅓ of that in the prior art, and the chip size in an integrated circuit can be greatly reduced. Further, since the detection voltage is determined by the pinch-off voltage, it can be controlled as required in the process.

BRIEF DESCRIPTION OF THE DRAWINGS

The invention will be better understood with reference to the description which follows taken in conjunction with the annexed drawings In which.

DESCRIPTION OF PREFERRED EMBODIMENTS

Figure 1:
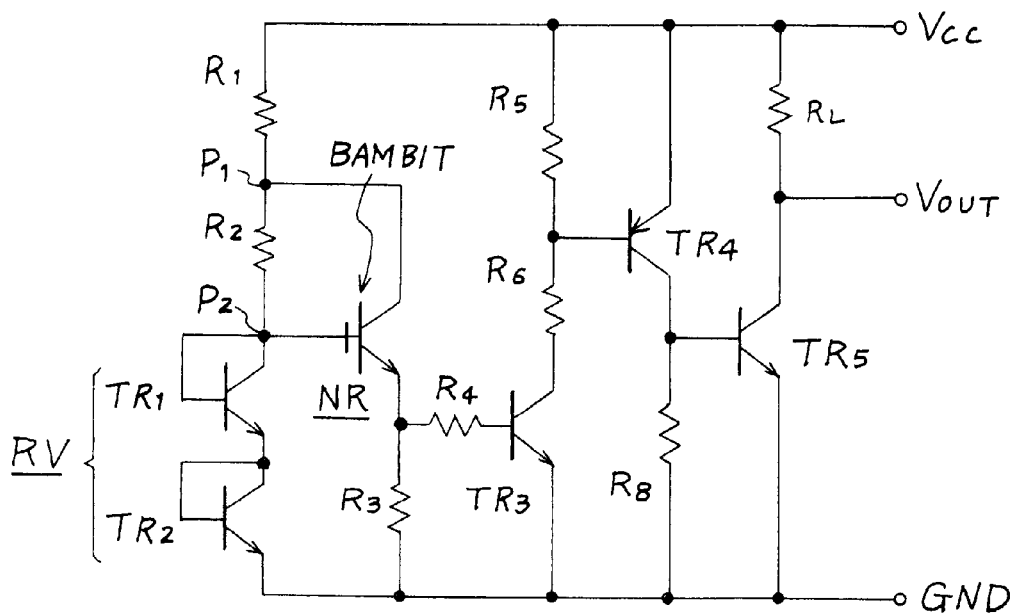
FIG. 1 is a circuit diagram, showing a source voltage detecting circuit according to a first embodiment of this invention.

A source voltage detecting circuit according to this invention will now be described in detail with reference to embodiments shown in the drawings.

FIG. 1 is a circuit diagram, showing a source voltage detecting circuit according to a first embodiment of this invention. The source voltage detecting circuit of this invention basically comprises a first resistor $R_1$, a second resistor $R_2$ and a reference voltage source RV which are connected in series between a power source $V_{CC}$ and the ground GND, the point of connection $P_1$ between said first and second resistors $R_1$ and $R_2$ being connected to the output terminal of a negative resistance characteristic section NR, the point of connection $P_2$ between said second resistors $R_2$ and said reference voltage source RV being connected to the input terminal of the negative resistance characteristic section NR.

In the embodiment shown in FIG. 1, transistors $TR_1$ and $TR_2$ constitute the reference voltage source RV, the latter being connected to the input of the negative resistance characteristic section NR. The drop of said source voltage is detected by the divisional voltages across the resistors $R_1$ and $R_2$ and is connected to the output of the negative resistance characteristic section NR. The negative resistance characteristic section NR in FIG. 1 shows a base modulation bipolar transistor (hereinafter referred to as BAMBIT).

In addition, in the circuit diagrams hereinafter shown, to make a distinction between the conventional transistor and the BAMBIT, a symbol different from the conventional one is used for the sake of convenience to represent the BAMBIT. The output from the emitter resistor R3 of the BAMBIT is amplified by a transistor $TR_3$ and reversed by a PNP transistor $TR_4$ so as to drive an output transistor $TR_5$.

Before a description is given of the circuit arrangement of the source voltage detecting circuit of this invention shown in FIG. 1, said base modulation bipolar transistor, BAMBIT, which is a negative transistor, will be described.

Figure 2:
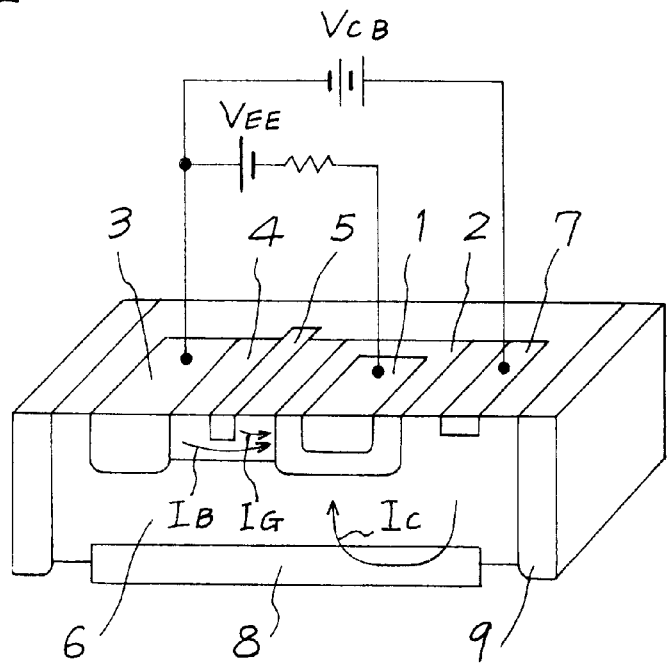
FIG. 2 is a schematic structural view, showing the construction of a negative transistor BAMBIT used in the source voltage detecting circuit of this invention.

This negative transistor BAMBIT is shown in FIG. 2, which is a schematic structural representation to be used for integrated circuits. This negative transistor BAMBIT comprises a $P^+$ base region 2 in contact with an emitter region 1, a $P^+$ base contact region 3 for taking out the base electrode, and a $P^-$ base region 4 having a gate region 5, said gate region 5 being connected at its end to a collector region 6. The base current is modulated in that a collector voltage is imparted to this gate portion, thereby a negative resistance characteristic is obtained in the collector current.

Figure 3:
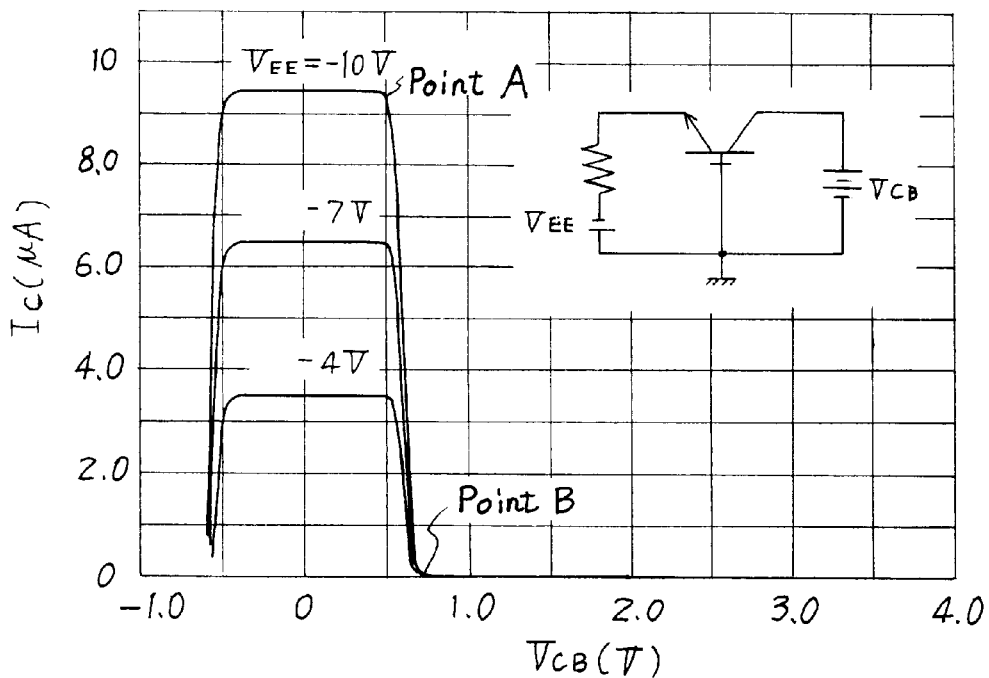
FIG. 3 is a grounded base characteristic diagram showing the grounded base characteristic of said negative transistor BAMBIT.

As for the electric static characteristics of this negative transistor BAMBIT, first, the grounded base characteristic is shown in FIG. 3. It is seen from FIG. 3, that as contrasted with the usual bipolar transistor, the collector current $I_C$ with respect to the collector-base voltage $V_{CB}$, decreases suddenly at point A in FIG. 3 and is completely cut off at point B. Hereinafter, the point A at which the collector current $I_C$ starts decreasing is referred to as $V_{CB}$ (ON) and the point B at which the corrector current $I_C$ is cut off as the pinch-off voltage $V_{CB}$ (OFF). This operation will now be described with reference to FIG. 2.

In FIG. 2, when a forward bias is applied between the base and the emitter while a low reverse bias is applied between the collector and the base, the electrons injected from the emitter region 1 mostly become a collector current as in the usual transistor. In the case of the BAMBIT, however, part of the electrons which are minority carrier reach the gate region 5 to appear as a gate current $I_C$, which is delivered as part of the collector current $I_C$. On the other hand, those minority carriers which have not been absorbed in the collector gate region are reunited to become the base current $I_B$. Then, the base current flowing as majority carriers immediately below the gate region 5 is influenced by the depletion layer in the gate region. However, with the low reverse bias applied between the gate and the base (the collector and the base), the collector current including the gate current does not almost change.

This is because the base current is sufficiently smaller than the saturated current value for the majority carriers which are present between the base contact region 3 and the $P^+$ base region 2. And in the case where the pinch-off voltage $V_{CB}$ (OFF) for the BAMBIT is designed to be about 0.7 V, the collector current sharply decreases from point A to point B in FIG. 3, where it is cut off. In the example of the characteristic of the BAMBIT shown in FIG. 3, the impurity concentration of the $P^-$ base region 4 was adjusted to $8\times10^{14}/cm^3$. In addition, the pinch-off voltage $V_{CB}$ (OFF) can be controlled by the impurity concentration of the P⁻ base region, the diffusion depth of the gate region, etc.

Figure 4:
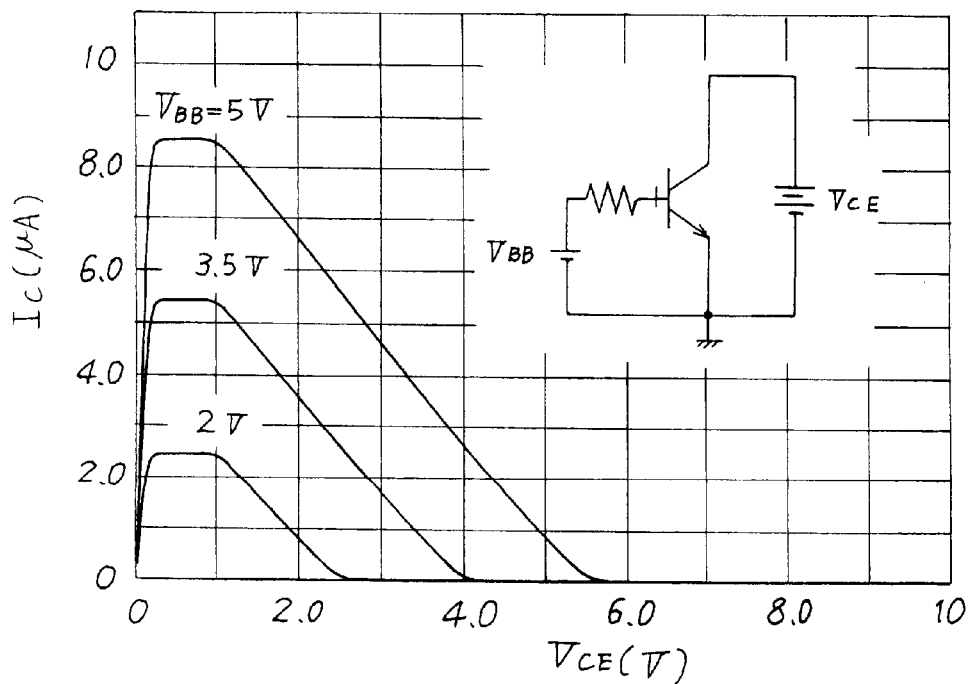
FIG. 4 is a grounded emitter characteristic diagram showing the grounded emitter characteristic of said negative transistor BAMBIT.
Figure 5:
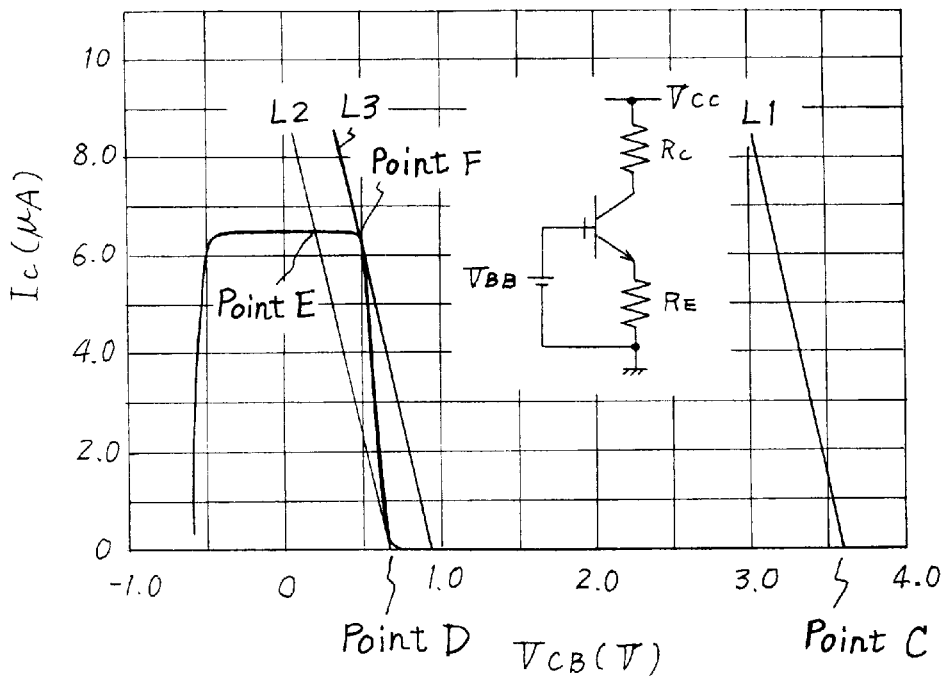
FIG. 5 is a switching explanatory view, with the base of the negative transistor BAMBIT grounded, for explaining the operation of source voltage detecting circuit of this invention.

The grounded base characteristic of the BAMBIT shown in FIG. 3 becomes the grounded emitter characteristic shown in FIG. 4. In FIG. 4, with the base input voltage $V_{BB}$ used as a parameter, the collector current $I_C$, whose peak current being the base input current $I_B$ multiplied by the current amplification factor $H_{FE}$, continuously linearly decreases, until it is cut off when the collector voltage reaches $V_{BB}+V_{CB}$ (OFF). In this case, in the characteristic shown in FIG. 2, since $V_{CB}$ (OFF)≈0.7 V, pinch-off occurs at $V_{CE} \approx V_{BB}+0.7$ V The switching characteristic for input to the BAMBIT will now be described with reference to FIG. 5. However, since the BAMBIT in the source voltage detecting circuit of FIG. 1 is used with its base grounded, the switching characteristic will be described with respect to grounded base. In FIG. 5 showing the basic circuit, when the source voltage $V_{CC}$ is sufficiently high and the collector-base voltage $V_{CB}=V_{CC}-V_{BB}>V_{CD}$ (OFF), the load line $R_C$ assumes L1 with respect to the characteristic curve for grounded base, the point of intersection with the load line being C. That is, the BAMBIT is in the cut-off state and the collector voltage $V_C=V_{CC}$. In the source voltage detecting circuit, the $V_{CC}$ lowers until the load line assumes L2 and the collector-base voltage $V_{CB}$ assumes a value which is not more than $V_{CB}$ (OFF), whereupon the base current $I_B$ starts to flow and so does the collector current $I_C$. When the collector current $I_C$ flows, the base current $I_B$ further increases owing to the collector current producing a voltage drop across the collector load and so does the collector current $I_C$.

Owing to this feedback, the point of intersection with the load line jumps instantaneously from point D to point E which is in the active range of the BAMBIT, thereby switching on the BAMBIT. On the other hand, the output voltage $V_E$ the emitter resistor $R_E$ is dependent on the base source voltage $V_{BB}$, so that $V_E=V_{BB}-V_{BE}$, becoming constant. After switching on, when the source voltage is increased, the output voltage $V_C$ from the collector increases though the output voltage $V_E$ from the emitter is constant. A point of intersection F between the load line and the characteristic curve moves again to the cut-off region, so that the BAMBIT is switched off. What has been stated so far can be represented by mathematical formulas as follows.

When the BAMBIT is in the active region, as in the usual transistor, the following relations hold.

$$V_{CC}=I_C \cdot R_C + V_C, \qquad \text{Formula (1)}$$

$$V_{BB}=V_{BE}+I_E \cdot R_E, \qquad \text{Formula (2)}$$

$$I_C=\{H_{FE}/(1+H_{FE})\} \cdot I_E. \qquad \text{Formula (3)}$$

Further, in order to switch on the BAMBIT and put the emitter output voltage $V_E$ in the high state, it is necessary to satisfy the formula $V_C-V_{BB} \leq V_{CB}$ (OFF). The threshold voltage $V_{CLH}$ at which the emitter output voltage $V_E$ turns from low to high can be found as follows.

Since it is when the collector-base voltage assumes a value which is not more than $V_{CB}$ (OFF) that this voltage is to be taken into account, $$V_C-V_{BB}=V_{CLH}-V_{BB}=V_{CB}(\text{OFF}). \qquad \text{Formula (4)}$$

Therefore, $$V_{CLH}=V_{BB}+V_{CB}(\text{OFF}). \qquad \text{Formula (5)}$$

On the other hand, in order to switch off the BAMBIT and to put the emitter output voltage $V_E$ in the low state, it is necessary to satisfy the formula $V_C-V_{BB} \geq V_{CB}$(ON). The threshold voltage $V_{CHL}$ at which the emitter output voltage $V_E$ turns from high to low can be found as follows, Since it is when the collector-base voltage assumes a value which is not less than $V_{CB}$ (ON) that this voltage is to be taken into account, from Formulas (1)–(3), there is obtained $$\begin{aligned} V_C - V_{BB} &= V_{CC} - I_C \cdot R_C - V_{BB} \\ &= V_{CC} - \{H_{FE}/(1+H_{FE})\} \cdot I_E \cdot R_C - V_{BB} \\ &= V_{CC} - \{H_{FE}/(1+H_{FE})\} \cdot \{(V_{BB}-V_{BE})/ \\ & \quad R_E\} \cdot R_C - V_{BB} \\ &= V_{CC} - \{H_{FE}/(1+H_{FE})\} \cdot (R_C/R_E) \cdot \\ & \quad (V_{BB}-V_{BE}) - V_{BB}. \end{aligned} \qquad \text{Formula (6)}$$

Set $$V_C-V_{BB}=V_{CHL}-\{H_{FE}/(1+H_{FE})\} \cdot (R_C/R_E)(V_{BB}-V_{BE})-V_{BB}=V_{CB}(\text{ON}). \qquad \text{Formula (7)}$$

Then, the threshold voltage $V_{CHL}$ is as follows.

$$V_{CHL}=\{H_{FE}/(1+H_{FE})\} \cdot (R_C/R_E) \cdot (V_{BB}-V_{BE})+V_{BB}+V_{CB}(\text{ON}). \qquad \text{Formula (8)}$$

Since $H_{FE}$ is sufficiently large, $V_{CHL}$ can be approximated as follows.

$$V_{CHL}=(R_C/R_E) \cdot (V_{BB}-V_{BE})+V_{BB}+V_{CB}(\text{ON}). \qquad \text{Formula (9)}$$

And the hysteresis voltage $V_{HYS}$ is $V_{CHL}-V_{CLH}$, that is, $$V_{HYS}=V_{CHL}-V_{CLH}=(R_C/R_E) \cdot (V_{BB}-V_{BE})-\{V_{CB}(\text{OFF})-V_{CB}(\text{ON})\}. \qquad \text{Formula (10)}$$

From Formulas (5), (9) and (10), the following can be seen. First, from Formula (5) it is seen that since the base voltage $V_{BB}$ is fixed, the threshold voltage $V_{CLH}$ depends only on the pinch-off voltage $V_{CB}$ (OFF). As described in FIG. 2, this can be controlled in the process.

From Formula (9) it is seen that since the base voltage $V_{BB}$ is fixed as in the case of the threshold voltage $V_{CLH}$ and since the base-emitter voltage $V_{BE}$ is a forward voltage and is a constant, the threshold voltage $V_{CHL}$ depends on the ratio of the collector resistor $R_C$ to the emitter resistor $R_E$ and on $V_{CB}$ (ON).

In an integrated circuit, even if the value of a resistor varies, the ratio of the collector resistor $R_C$ to the emitter resistor $R_E$ is almost fixed and is determined solely at the early design stage. As for $V_{CB}$ (ON), it is determined by a change in the base current due to the collector-base voltage in the negative resistance region from point A to point B shown in FIG. 3, that is, it is determined by the transfer conductance. This is uniquely determined from the pinch-off voltage $V_{CB}$ (OFF) by the structure of the BAMBIT. Therefore, if the pinch-off voltage $V_{CB}$ (OFF) is fixed in the process, $V_{CB}$ (ON) will never vary and for the threshold voltage $V_{CHL}$ it is only necessary to control the pinch-off voltage $V_{CB}$ (OFF) alone.

From Formula (10), the same may be said of hysteresis. In Formula (10), the first term, which is determined by the ratio of the collector $R_C$ to the emitter resistor $R_E$, is constant. Further, the second term is determined by the pinch-off voltage $V_{CB}$ (OFF). Thus, it follows that for the hysteresis also, it is only necessary to control $V_{CB}$ (OFF) alone. However, $V_{CB}$ (OFF)-$V_{CB}$ (ON), as described above, somewhat varies according to the value of the pinch-off voltage $V_{CB}$ (OFF).

Figure 6:
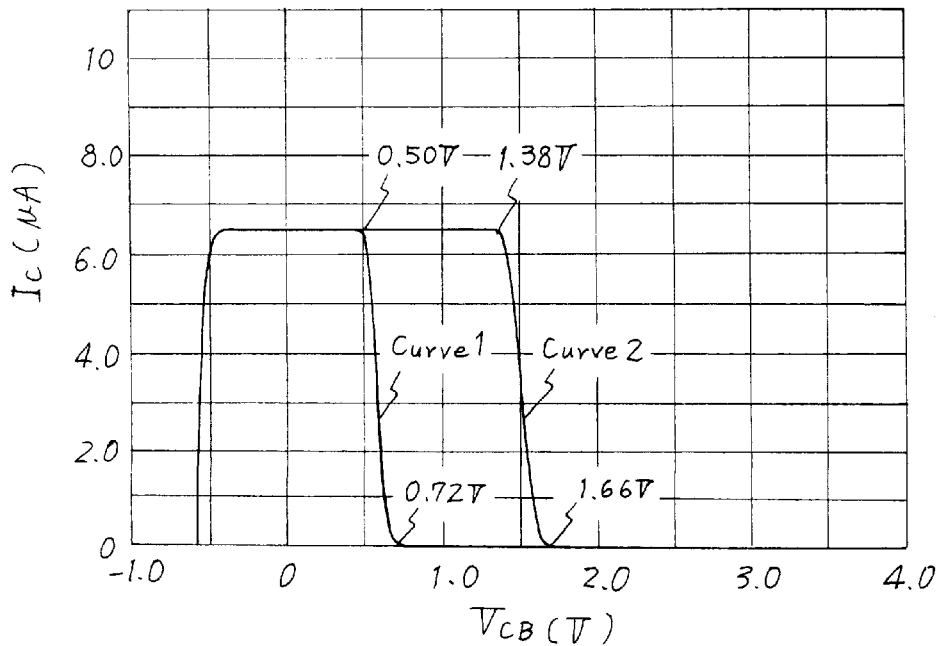
FIG. 6 is a grounded base characteristic diagram with different pinch-off voltages for said negative transistor BAMBIT.

This state is shown in FIG. 6. As shown in FIG. 6, at the pinch-off voltage $V_{CB}$ (OFF)=0.72 V, $V_{CB}$ (OFF)−$V_{CB}$ (ON)=0.22 V, and at $V_{CB}$ (OFF)=1.66 V, $V_{CB}$ (OFF)−$V_{CB}$ (ON)=0.28 V. Therefore, the variation in hysteresis between the pinch-off voltage $V_{CB}$ (OFF)=0.72 V and $V_{CB}$ (OFF)= 1.68 V is only 60 mV.

The grounded base switching characteristic of the BAMBIT, which forms the operation principle of the source voltage detecting circuit shown in FIG. 1, has been described so far, and this will now be applied to the embodiment shown in FIG. 1.

In FIG. 1, the voltage drop in the power source is detected by the voltage across the resistor $R_2$. When source voltage $V_{CC}$ lowers until the voltage across the resistor $R_2$ is not more than the pinch-off voltage $V_{CB}$ (OFF), the BAMBIT is switched on. In the same manner as in Formula (5), the threshold voltage $V_{CLH}$ can be found as follows.

$$V_{CLH}=E_V+\{(R_1+R_2)/R_2\}\cdot V_{CB}(\text{OFF}). \quad \text{Formula (11)}$$

In this case, $E_V$ indicates the voltage value of the reference voltage source RV and in the embodiment shown in FIG. 1, it is twice the forward voltage between the base and emitter, or about 1.2 V.

Further, Since it is when the voltage across the resistor $R_2$ assumes a value which is not less than $V_{CB}$ (ON) that the threshold voltage $V_{CHL}$ is to be taken into account, it can be found in the same manner as in Formula (9). Thus, $$V_{CHL}=(R_1/R_3)\cdot(E_V-V_{BE})+E_V+\{(R_1+R_2)/R_2\}\cdot V_{CB}(\text{ON}) \quad \text{Formula (12)}$$

In addition, in FIG. 1, the resistor $R_4$ is capable of serving as an emitter load for the BAMBIT, but should be such that it is sufficiently larger than the resistor $R_3$ so as not to cause a variation in the emitter voltage of the BAMBIT.

The hysteresis voltage $V_{HYS}$ is as follows.

$$V_{HYS}=V_{CHL}-V_{CLH}=(R_1/R_3)\cdot(E_V-V_{BE})-\{(R_1+R_2)/R_2\}\cdot\{V_{CB}(\text{OFF})-V_{CB}(\text{ON})\} \quad \text{Formula (13)}$$

From Formulas (11), (12) and (13), the following may be said.

From Formula (12), the threshold voltage $V_{CLH}$ is determined by the pinch-off voltage $V_{CB}$ (OFF) in the same manner as in Formula (5), and since the coefficient $(R_1+R_2)/R_2$ is fixed with respect to a variation in the process, for the threshold voltage $V_{CLH}$ as a detection voltage it is only necessary to control the pinch-off voltage $V_{CB}$ (OFF) alone to meet demands.

It is seen from Formula 12 as in Formula 9 that the threshold voltage $V_{CHL}$ is determined by the ratio of the collector resistor $R_1$ to the emitter resistor $R_3$, i.e., $(R_1/R_3)$, and $V_{CB}$ (ON) and its coefficient. The coefficient $(R_1/R_3)$ and coefficient $(R_1+R_2)/R_2$ are almost fixed with respect to a change in the process and $V_{CB}$ (ON) is uniquely determined form the pinch-off voltage $V_{CB}$ (OFF). Therefore, for the threshold voltage $V_{CHL}$ as in the case of the threshold voltage $V_{CLH}$ it is only necessary to control $V_{CB}$ (OFF) alone in the process. This results in showing that the hysteresis voltage $V_{HYS}$, as indicated by Formula (13), is highly resistant to a variation in the resistor value accompanying a variation in the process.

In addition, the source voltage detecting circuit according to this invention is used for control in connection with a demand of a detection voltage by the pinch-off voltage $V_{CB}$ (OFF).

In the embodiment shown in FIG. 1, if it is used as a microcomputer voltage monitor, detection voltage is often provided at not more than 4 V as microcomputers are tending to be operated at increasingly low voltage. The pinch-off voltage which is found by zeroing the temperature coefficient of the threshold voltage as will be later described may be 2 V or less, and in the case of Formula 13, the hysteresis variation is influenced by the coefficient $(R_1+R_2)/R_2$ in contrast with the case of Formula 10; however, the hysteresis variation is not more than 100 mV. This order of variation raises almost no problem in practice.

Accordingly, in this invention, there is no need to change the circuit constants for a demand of a detection voltage of about 2 to about 4 V, it being only necessary to control the pinch-off voltage $V_{CB}$ (OFF) alone.

Next, a description will now be given of the temperature characteristics of detection voltage in the first embodiment. The rate of change of detection voltage with respect to temperature which is required when microcomputer voltage is being monitored is very severe, being 0.01%/° C.

The rate of change of detection voltage with respect to temperature according to this invention can be obtained by differentiating Formula 11 with respect to temperature. The coefficient $(R_1+R_2)/R_2$ of the second term of Formula (11) will not vary since in an integrated circuit both the denominator and the numerator have the same rate of change with respect to temperature. Therefore, the rate of change of detection voltage with respect to temperature is as follows.

$$dV_{CLH}/dT=(dE_V/dT)+\{(R_1+R_2)/R_2\}\cdot\{dV_{CB}(\text{OFF})/dT\}. \quad \text{Formula (14)}$$

The condition for the rate of change of detection voltage with respect to temperature to reduce to zero is obtained by putting Formula (14)=0. Thus, $$R_1/R_2=-1-[\{(dE_V/dT)\}/\{dV_{CB}(\text{OFF})/dT\}]. \quad \text{Formula (15)}$$

Specific examples of numerical values will now be given. In FIG. 1, the reference voltage $E_V$ is provided by the base-emitter forward voltages provided by the transistors $TR_1$ and $TR_2$, and assumes a minus value. Since it comprises two divisional voltages, $\{dE_V/dT\}\approx-2.2$ mV/° C.×2≈−4.4 mV/° C. Further, the pinch-off voltage $V_{CB}$ (OFF) changes in that in FIG. 2 the resistivity of the P⁻ region which is immediately below the gate region increases with temperature change; $dV_{CB}$ (OFF)/dT≈+3 mV/° C. Therefore, the temperature change of detection voltage is zero when $R_1/R_2=1/2.1$. The source voltage detecting circuit according to this invention is capable of simultaneously canceling the temperature changes of detection voltage by suitably selecting the ratio of the resistors $R_1$ and $R_2$ for voltage detection, without using a special temperature compensation circuit for temperature characteristic.

Concerning the threshold voltage which is a detection voltage shown by Formula (11), the pinch-off voltage $V_{CB}$ (OFF) to be process-controlled is found by a target detection voltage by inserting in Formula (11) the quantity $R_1/R_2$ whose value is such that the temperature change of detection voltage is made zero.

Figure 7:
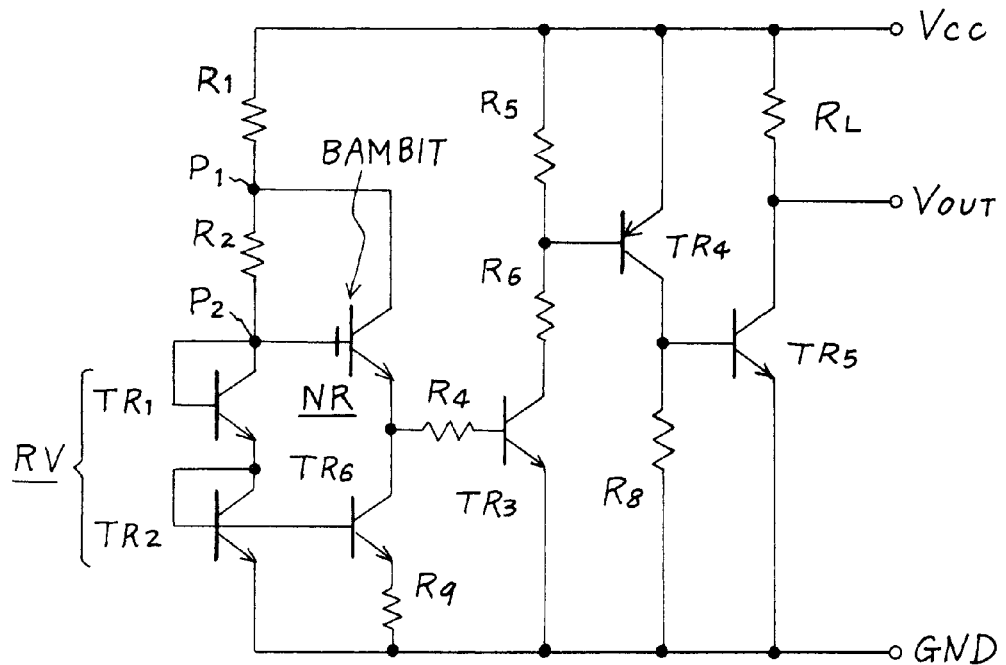
FIG. 7 is a circuit diagram showing a source voltage detecting circuit according to a second embodiment of this invention.

A source voltage detecting circuit according to a second embodiment of this invention is shown in FIG. 7. In this second embodiment, the emitter resistor $R_3$ in the first embodiment described above is replaced by a transistor $TR_6$, which is an active element. As compared with the resistor $R_3$, the use of the transistor $TR_6$ requires a smaller chip area, making it possible to reduce the chip size.

Figure 8:
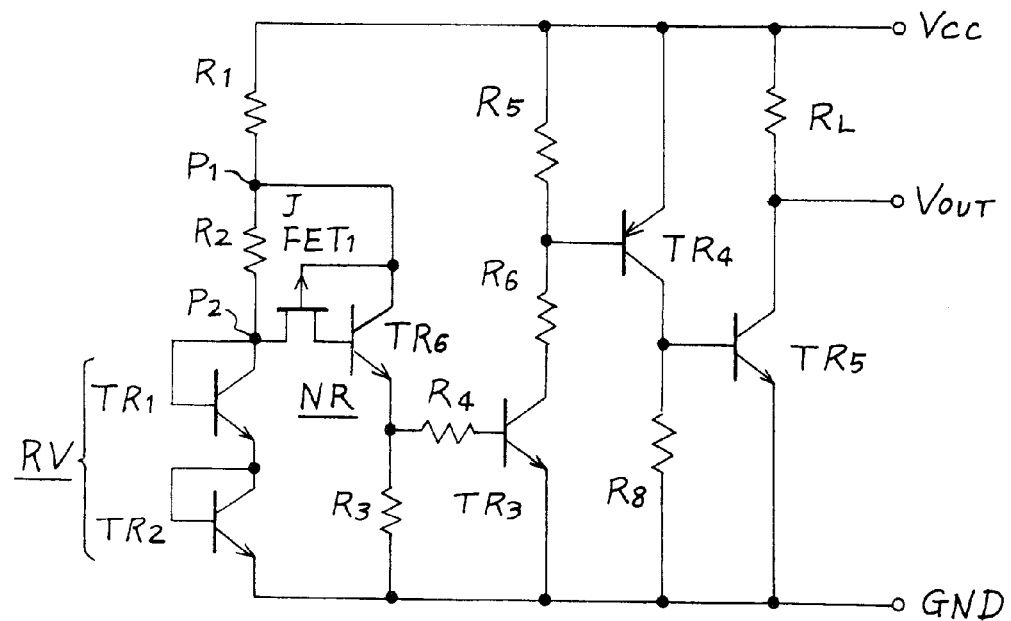
FIG. 8 is a circuit diagram showing a source voltage detecting circuit according to a third embodiment of this invention.

A source voltage detecting circuit according to a third embodiment of this invention is shown in FIG. 8. In this third embodiment, the negative resistance characteristic is created in a quasi manner by a transistor $TR_6$ and a junction type field effect transistor J-FET₁, rather than by the negative resistance element BAMBIT. In this case, unlike the BAMBIT, in FIG. 2, the absence of the absorption of minority carriers from the gate region 5 and of the conduction modulating action by minority carriers in the P⁻ base region 4 makes it impossible to expect high speed switching. On the other hand, the saturated current value of FET for the base current can be freely set and the saturated current value of FET can be set at a large value for the base current, so that the transfer conductance can be set at a larger value. As a result, the change in $V_{CB}$ (ON) can be reduced with respect to the pinch-off voltage $V_{CB}$ (OFF), so that the variation of hysteresis can be minimized with respect to any required detection voltage.

Figure 9:
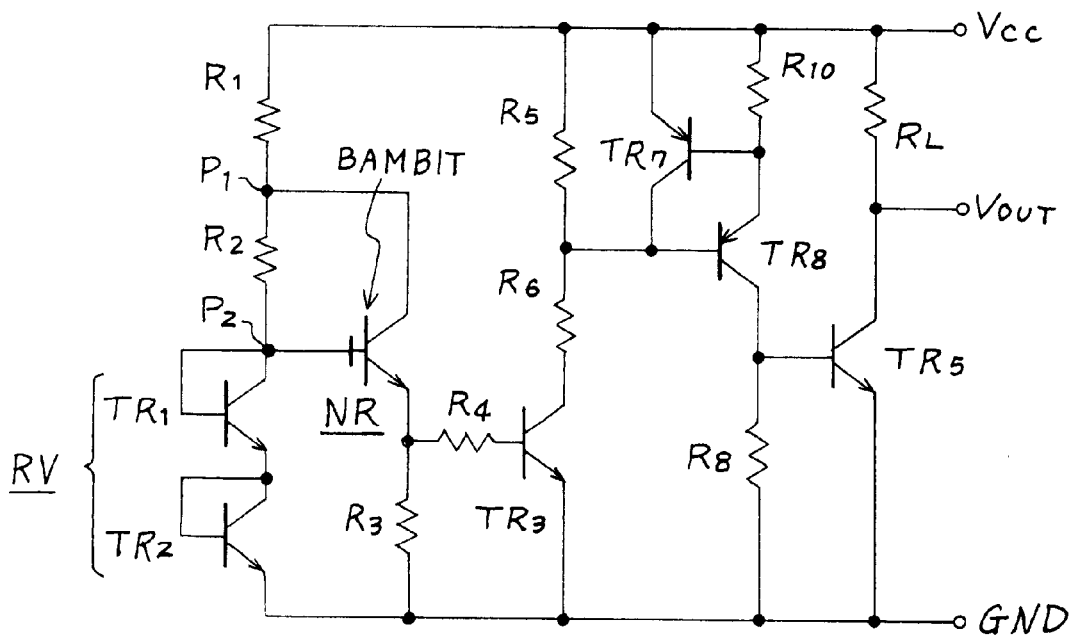
FIG. 9 is a circuit diagram showing a source voltage detecting circuit according to a fourth embodiment of this invention.
Figure 10:
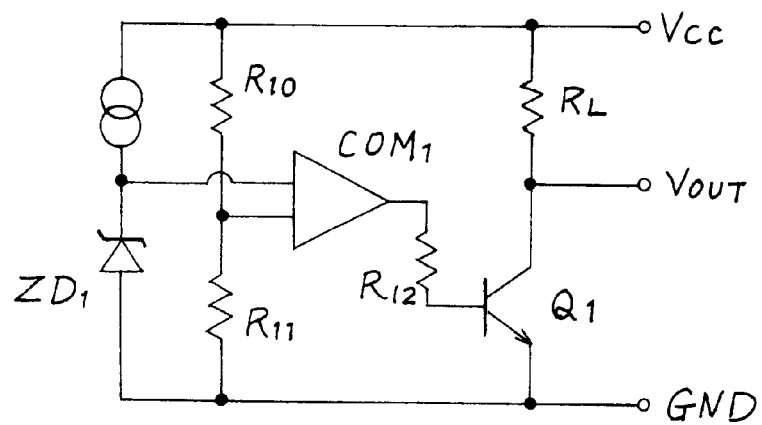
FIG. 10 is a circuit diagram showing an example of a conventional source voltage detecting circuit.
Figure 11:
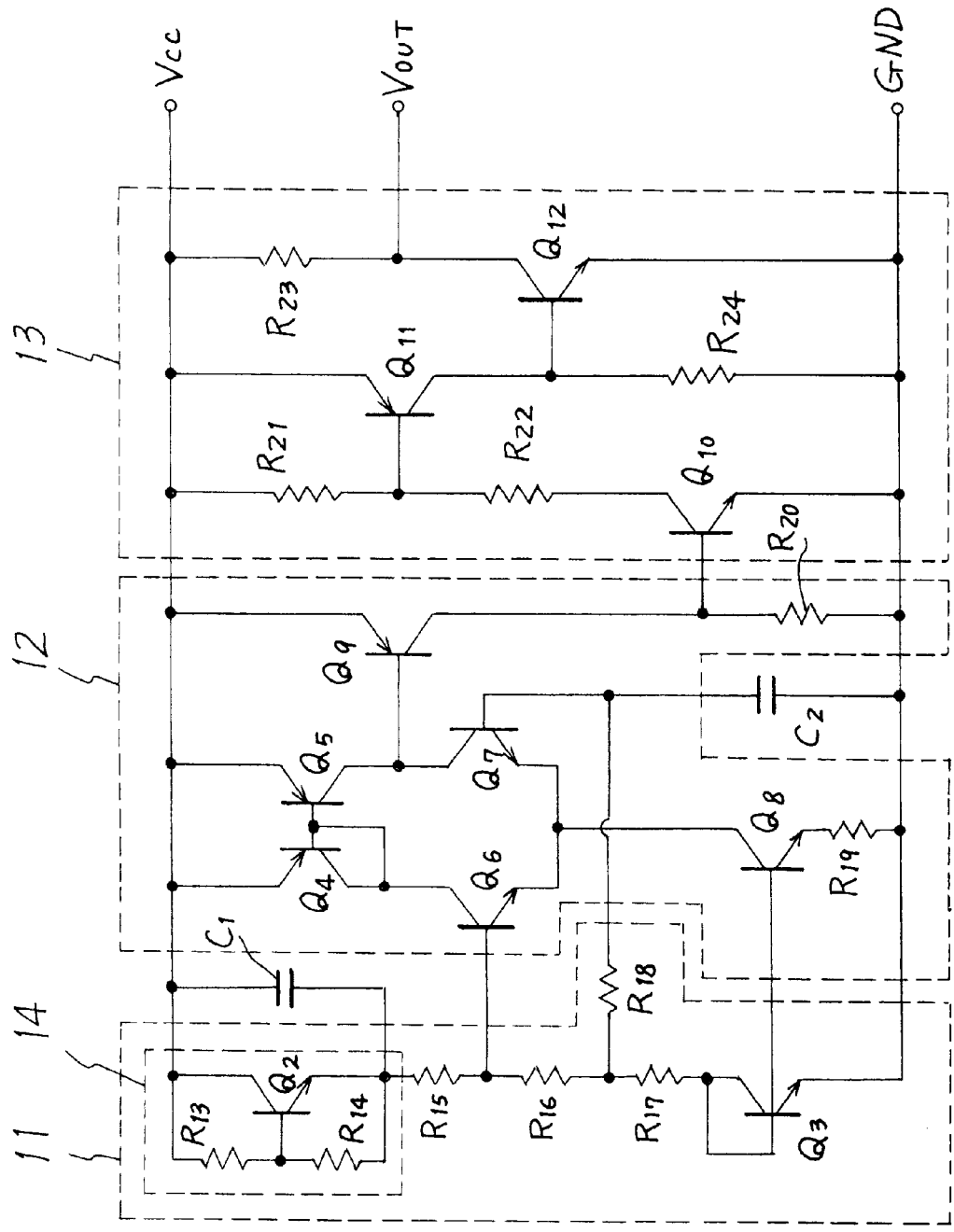
FIG. 11 is a circuit diagram showing another example of a conventional source voltage detecting circuit.

Further, a source voltage detecting circuit according to a fourth embodiment of this invention is shown in FIG. 9. In this fourth embodiment, the transistor $TR_4$ for driving the output transistor $TR_5$ in the first embodiment is replaced by transistors $TR_7$ and $TR_8$ to drive the output transistor $TR_5$ in a fixed current manner. With this arrangement, it is possible to feed a stabilized output even when the detection voltage is as low as about 2 V.

According to the source voltage detecting circuit of this invention constructed in the manner described above, any source voltage is detected at the pinch-off voltage $V_{CB}$ (OFF) of negative resistance characteristic without requiring a separate circuit for temperature characteristic compensation; therefore, as compared with the conventional circuit, the number of elements constituting transistors, resistors, capacitors, etc., can be greatly reduced. As a result, the chip area for integrated circuits can be reduced to about ⅓ as compared with the conventional integrated circuit according to the same design rule, leading to a great reduction in cost.

Further, the source voltage detecting circuit of this invention is adapted to set a detection voltage with the value of the pinch-off voltage $V_{CB}$ (OFF) of negative resistance characteristic, so that it is unnecessary to prepare as many pattern masks having different circuit constants as there are required detection voltages and the number can be set during process.

What is claimed is:

1. A source voltage detecting circuit, comprising first and second resistors and a reference voltage source which are connected in series between a power source and the ground, said reference voltage source includes a transistor, wherein the point of connection between said first and second resistors is connected to an output terminal of a negative resistance characteristic section, and the point of connection between said second resistor and the reference voltage source is directly connected to an input terminal of the negative resistance characteristic section, said negative resistance characteristic section includes a first electrically conductive type collector region serving as the output terminal, second electrically conductive type base region formed through a first PN junction with respect to said collector region, and a first electrically conductive type emitter region formed through a second PN junction with respect to said base region.

2. A source voltage detecting circuit in the form of a base modulation bipolar transistor, as set forth in claim 1, characterized in that said base region includes a first base region disposed adjacent said emitter region through said second PN junction, a base contact region spaced from said first base region and serving as the input section of the negative resistance characteristic section and serving to take out the base electrode, and a second base region of low impurity concentration formed between said first base region and said base contact region, said second base region provided therein with a gate region having a first electrically conductive type connected to the collector region, the arrangement being such that, when a forward bias is applied between said base contact region and said emitter region and when the collector region is energized with a reverse bias with respect to said base collector region, the base current flowing through said second base region is modulated to provide a negative resistance characteristic.

3. A source voltage detecting circuit as set forth in claim 1, characterized in that the negative resistance characteristic section uses the source of a junction type FET as an input section of the negative resistance characteristic section, the drain of the junction type FET being connected to the base of a bipolar transistor, the gate of said junction type FET being connected to the collector of said bipolar transistor, the collector of said bipolar transistor being an output section of the negative resistance characteristic section.

* * * * *